(12) United States Patent  
Mehalel

(10) Patent No.: US 7,424,663 B2  
(45) Date of Patent: Sep. 9, 2008

(54) LOWERING VOLTAGE FOR CACHE MEMORY OPERATION

(75) Inventor: Moty Mehalel, Haifa (IL)

(73) Assignee: Intel Corporation, Santa Clara, CA (US)

( * ) Notice: Subject to any disclaimer, the term of this patent is extended or adjusted under 35 U.S.C. 154(b) by 349 days.

(21) Appl. No.: 11/039,742

(22) Filed: Jan. 19, 2005

(65) Prior Publication Data

US 2006/0161831 A1 Jul. 20, 2006

(51) Int. Cl.
*G11C 29/00* (2006.01)

(52) U.S. Cl. ................................... 714/763
(58) Field of Classification Search ............. None
See application file for complete search history.

(56) References Cited

U.S. PATENT DOCUMENTS

| | | | | |
|---|---|---|---|---|
| 5,754,558 A * | 5/1998 | Hayakawa et al. | ........... | 714/721 |
| 5,909,404 A * | 6/1999 | Schwarz | ..................... | 365/201 |
| 5,930,185 A * | 7/1999 | Wendell | ..................... | 365/201 |
| 5,956,350 A * | 9/1999 | Irrinki et al. | ................. | 714/718 |
| 5,959,890 A * | 9/1999 | Yamamoto et al. | ..... | 365/185.23 |
| 6,317,361 B2 * | 11/2001 | Yoshida et al. | ......... | 365/185.09 |
| 7,057,958 B2 * | 6/2006 | So et al. | ..................... | 365/211 |
| 7,120,071 B2 * | 10/2006 | An | ............................. | 365/201 |
| 7,129,098 B2 * | 10/2006 | Rizzo et al. | .................... | 438/3 |
| 2005/0110498 A1 * | 5/2005 | Plett | .......................... | 324/433 |
| 2005/0195639 A1 * | 9/2005 | Fukushi et al. | .............. | 365/149 |
| 2005/0204237 A1 * | 9/2005 | Burdine et al. | .............. | 714/736 |
| 2005/0281112 A1 * | 12/2005 | Ito et al. | ..................... | 365/222 |
| 2005/0283566 A1 * | 12/2005 | Callaghan | .................. | 711/104 |
| 2006/0221756 A1 * | 10/2006 | Miura et al. | ........... | 365/230.03 |

* cited by examiner

*Primary Examiner*—Jacques Louis-Jacques
*Assistant Examiner*—Guerrier Merant
(74) *Attorney, Agent, or Firm*—Blakely, Sokoloff, Taylor & Zafman LLP

(57) ABSTRACT

Setting a minimum operating voltage (Vcc min) of the cache to a voltage value at which the number of cells that fail in the cache is between approximately 0.1% and approximately 1% of the number of lines in the cache, while the remaining cells continue to function correctly at the voltage value chosen for Vcc min, and compensating for errors produced by memory cells in the cache that fail when operated at the voltage value chosen for Vcc min.

30 Claims, 2 Drawing Sheets

LOWERING VOLTAGE FOR CACHE MEMORY OPERATION

BACKGROUND

For mobile processor based systems, including, for example laptop computers, personal digital assistants, and smart devices such as game devices or multi-function communication devices, it is advantageous to reduce power consumption both to prolong battery life and to reduce processor generated heat. One method to achieve this is to design a processor of the system to lower the minimum voltage at which the processor operates.

Processors may include an on-die cache to improve performance. The Random Access Memory (RAM) cells of the cache may limit the lowest possible voltage at which the processor may be operated. This is because RAM cells in on-die processor caches are manufactured from devices typically designed to the smallest possible size supported by the fabrication process used to manufacture the processor, and the devices are, as a side effect, very sensitive to variations that normally occur during manufacturing, causing a few cells to deviate significantly from the average in terms of the minimum voltage required for them to operate correctly. Therefore, in order to ensure that all the cells in the on-die cache operate correctly, the minimum operating voltage of the processor core is often set to a value that meets or exceeds the maximum value required by those few cells, and thus may be significantly higher than the value that would be required to ensure the operation of a normally manufactured or average cell in the cache.

DETAILED DESCRIPTION

Figure 1:
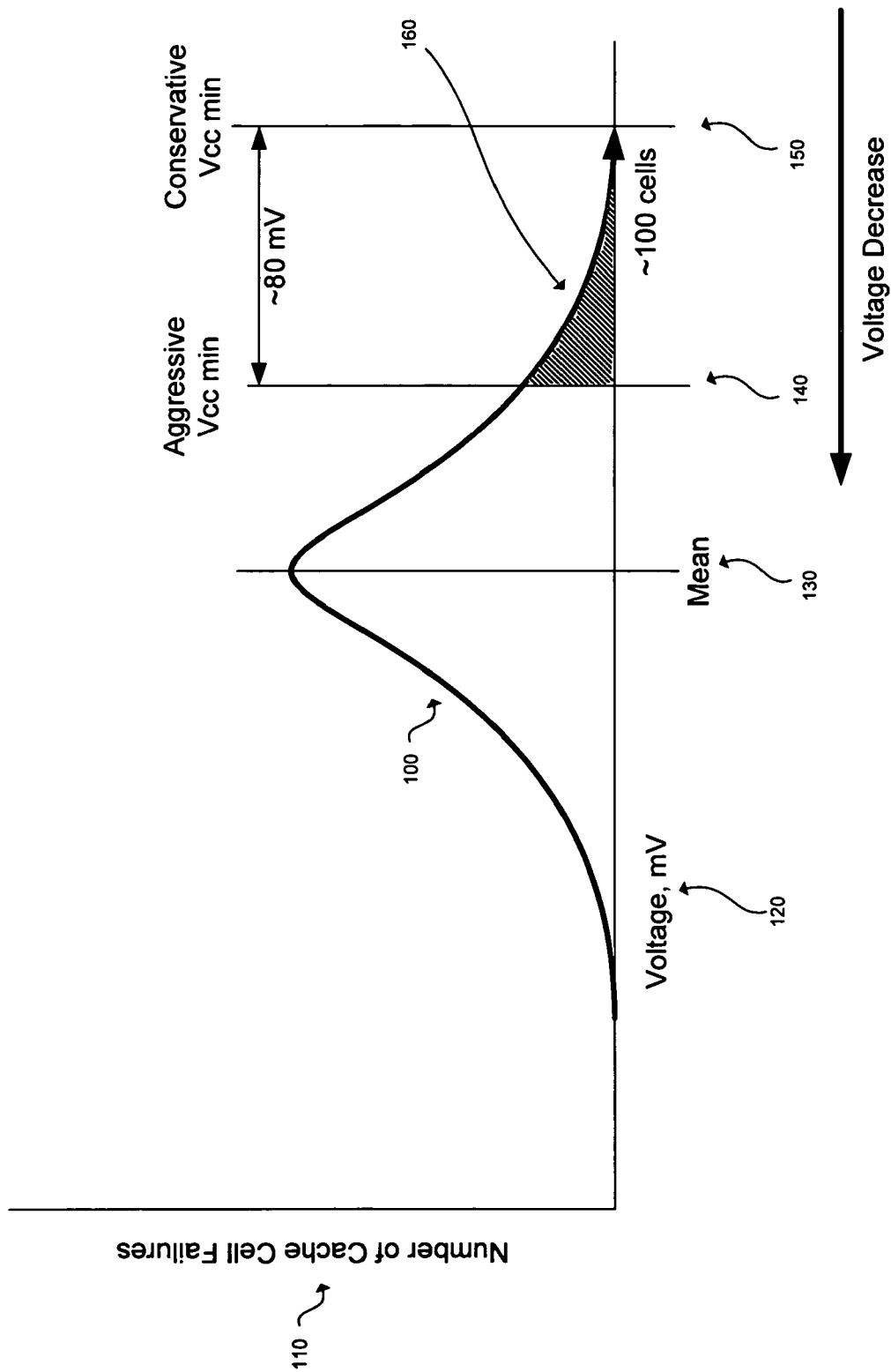
FIG. 1 depicts a graph of the number of failing cells against operating voltage in one embodiment.

Generally, the distribution of the operating voltage at which the cells in a processor cache fail may be modeled by a statistical distribution. In some embodiments this may be a normal distribution. The graph in FIG. 1 represents part of an exemplary normal distribution 100 of the number of failing cells 110 against the minimum operating voltage 120, sometimes termed Vcc min or alternatively Vss min in the art, for a cell in the cache, based on empirical data. It is important to note that the curve is representative, not to scale, and is meant only to illustrate the concepts discussed hereinafter. As is expected for a normal distribution, as the voltage is decreased from a high value at which all the cells operate correctly, i.e., a conservatively high Vcc min 150, a few statistical outlier cells, that is, the ones that deviate most from normal behavior, fail first. These cells are shown in the region of the curve 160. Then, as the voltage is further decreased, more and more cells begin to fail, until by the time the nominal or average failure voltage 130 is reached, large numbers of cells in the cache begin to fail 130. The right end or tail of this curve indicates that a relatively large voltage shift (in one embodiment about 80 mV) is necessary before the rate of failure per millivolt spikes, i.e., increases appreciably as at 140. In statistical terms, for the cache in this embodiment, this point 140 is the point at which the number of cells that fail is about 0.001% or $1/10^5$ of the total, which is about 4.2 standard deviations (or 4.2*SD) above the mean (M) in this embodiment, (i.e M+4.2*SD) As shown in the graph, only about 100 cells, representing this small fraction (0.001%) of the cache (which may in a typical case have $\sim 10^7$ or tens of millions of cells), have actually failed at the 4.2 sigma point which is 80 mV below a conservatively high value for Vcc min. FIG. 1 at 140 in this example. A 80 mV reduction in minimum operating voltage, however, represents an appreciable reduction in power consumption.

In one embodiment the minimum voltage may be lowered to the "aggressive" level indicated in FIG. 1, which is generally between about 3.7 and 4.7 standard deviations from the mean, i.e., between M+3.7*SD and M+4.7*SD, and thus the minimum power at which a processor core and the on-die cache can operate. This corresponds to an operating voltage at which a fraction of between a ten-thousandth ($\sim 1/10^4$) and a millionth ($\sim 1/10^6$) of the cache cells will fail.

Alternative approaches based on different methods of achieving a lowered voltage that causes a small number of cells relative to the total cache size may be used in other embodiments. One approach in selecting the operating voltage for the cache may be empirical. In one such approach, a small number of failed cells that is acceptable is determined based on the level of reliability desired for the cache. The behavior of the cache is determined either experimentally or analytically to decide on a lowered operating voltage for the cache at which the number of cells fail is approximately a specified small number, such as 100 cells in one embodiment. In other embodiments, this number of cells may be selected based on the number of lines in the cache, for example as a fraction of the number of lines in the cache, because in many cache designs, it is possible to fix no more than one bit error per cache line. Therefore, it is important to minimize the likelihood that more than one cell per cache line will fail at the lowered voltage. For example, if the number of memory cells in the cache that fail at the minimum operating voltage of the cache is greater than 1% of the number of lines in the cache, some embodiments may choose a minimum operating voltage at which the number of cells that fail in the cache is between 0.1% and 1% of the number of lines in the cache. Many other empirical approaches of this type are possible, as will be appreciated by one in the art.

Once the lowered operating voltage is selected, the cache may still be operated without data errors in this embodiment if the expected errors in the functioning of the few outlier cells that fail at the lowered minimum operating voltage can be circumvented. Because the cells would fail the same way every time the voltage was lowered, i.e., repeatably, a test conducted by lowering the voltage supplied by a voltage source to the cells could identify them during manufacture and a scheme such as the use of redundant elements, or another such as the use of fuses, as known in the art, might potentially be used to circumvent their use in some embodiments. However because of the nature of the manufacturing processes that create the excursions that in turn lead to the outlier cells, the outlier cells tend to be randomly distributed throughout the cache and this may create problems for the use of redundant elements. Die area constraints can also prevent the placement of enough fuses to practically circumvent the errors in the approximately 100 cells. Therefore, another method of circumventing errors caused by these cells may be used in other embodiments.

Figure 2:
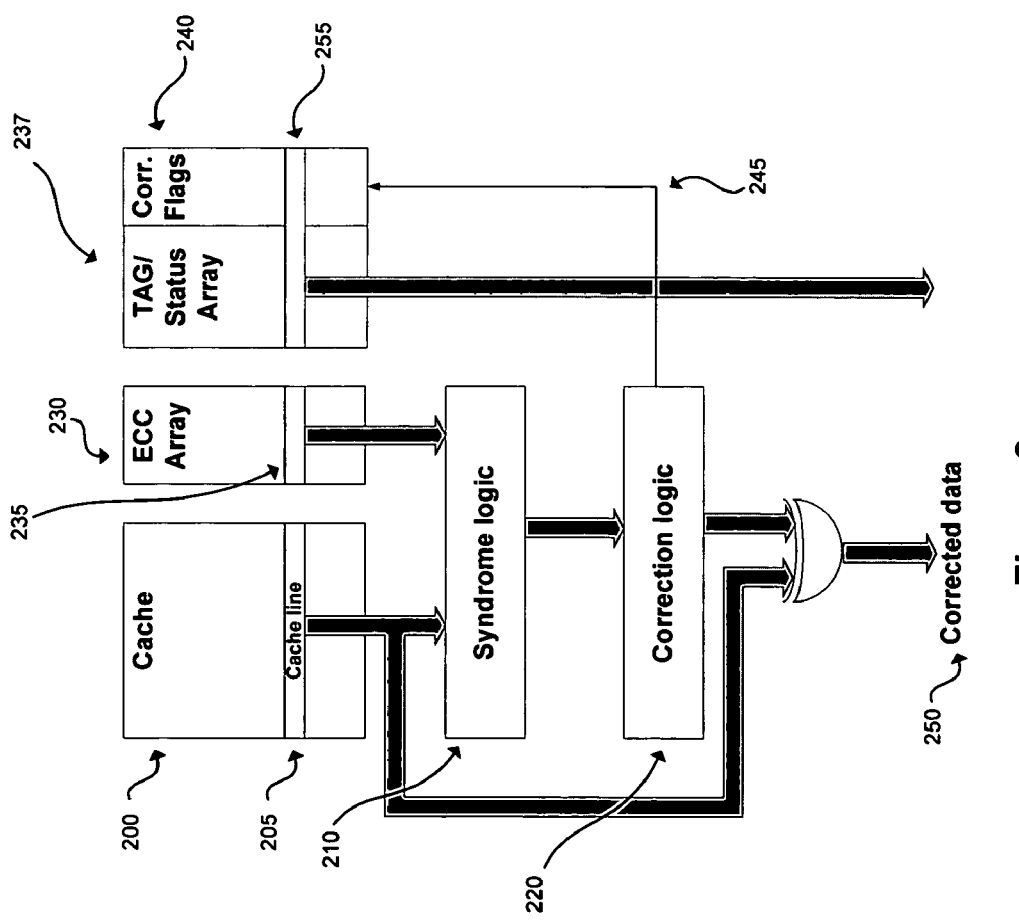
FIG. 2 depicts a high level architecture of a cache with an error correction circuit including correction marking in one embodiment.

It is typical in large processor cache designs to include an error correcting code (ECC) unit as shown in FIG. 2. Several ECC schemes are practiced in the art. For one simple example, a Single-Bit-Correction-Double-Bit-Detection (SBC-DBD) scheme allows the correction of one bit errors in a line of cache, and the detection, but not correction of two bit errors. Many other schemes are known, and are not discussed here; SBC-DBD is only mentioned as an exemplary embodiment of ECC. The basic underlying principles of ECC are well known and are not discussed here. Generally, an ECC unit is provided as part of a cache design in order to correct for unpredictable and non-repeating errors in memory cells caused by random radiation events, also known as soft errors.

When the cache is large, the likelihood of more than one cell with a high minimum operating voltage requirement being present in a single line of the cache is extremely small. As explained above, about 100 cells in a typical cache have significantly higher minimum operating voltage requirements than an average cell in the cache, but the cache may have ~$10^5$ lines, for example, 64 K lines; and the 100 cells are generally randomly distributed among the cache lines. Thus, the probability of a soft error in a memory cell, which is itself a very low probability event, occurring in the same cache line as a cell having a high minimum operating voltage requirement, is also very small. Thus, it is possible to lower minimum operating voltage to a level where the outlier cells in the cache, i.e., the ~100 cells that are expected to fail, actually fail, and rely on the ECC mechanism used for soft error correction to also correct for these outlier cells.

FIG. 2 depicts a high level architectural diagram representing an ECC unit in one embodiment. In the embodiment, this ECC unit is used to correct both for soft errors and for outlier cells in the memory cells of the cache 200 after the processor core minimum operating voltage is set deliberately low, i.e., to a value that would cause a small number of outlier cells to fail. As is known in the art, ECC bits are computed for every line of cache and stored in the ECC array 230. When a cache line 205 is read out of the cache the corresponding ECC bits 235 and the syndrome logic unit 210 are used to compute a correction, if any errors are detected, in the correction logic 220 to produce the corrected data 250.

As is known in the art, a tag array 237 is used to address individual lines in the cache. When ECC is used with a cache, the tag array may be extended in width with a set of correction flag bits 240 that may be used to keep track of errors that occur in the cache and are detected and corrected by ECC. The correction logic keeps the correction flags updated, 245. The correction bits 255 associated with each cache line may be used to keep track of soft errors that occur in each cache line; they may also in this embodiment be used to determine cache lines where memory cells have failed due to aggressively low operating voltage, as discussed above. It is possible to distinguish between errors that occur due to radiation, i.e., soft errors, and those that result from outlier cells due to low operating voltage. The soft errors are not generally repeatable, because radiation hits on memory cells in the cache are random. However, the same outlier cells would fail repeatedly on lowering the operating voltage.

Because the ECC described for this embodiment can only correct for single bit errors, an outlier cell in a cache line introduces the remote possibility that a radiation induced soft error in the same cache line could create a double failure that an SBC-DBD scheme could not fix, causing an actual data error. The correction flag data may be used to overcome this concern and be used to detect and disable cache lines with outlier cells in some embodiments where even the small chance of having a radiation hit in the same line as an outlier cell is intolerable, as in critical server processor caches. In other applications, a more complex ECC scheme may be used in those embodiments to allow more than one bit error fixing, although this usually results in a die size penalty. In other embodiments, the risk of having an outlier cell error in the same row as a potential soft error may be considered acceptable.

Figure 3:
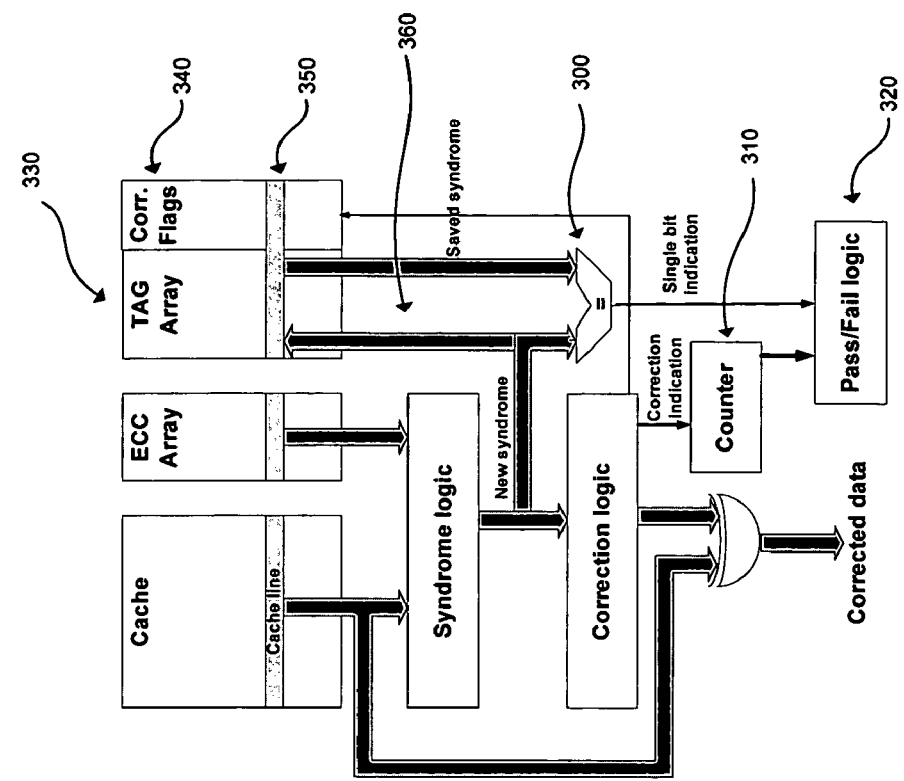
FIG. 3 depicts a high level architecture of a test setup for a cache with an error correction circuit in another embodiment.

In some cases the possibility that more than one outlier cell happens to occur in a single cache line, that is, that no cache line has more than a single-bit failure, may be tested. A scheme for this purpose is shown in FIG. 3, which shows an extension of the architecture shown previously in FIG. 2 for testing the cache. In FIG. 3, the tag array 330 including the extension for flag bits 340 is used to store a syndrome computed for each cache line when a correction occurs. The process used to test the cache for any lines with more than a single-bit failure is as follows. In the test, the syndrome bits indicate for each line whether the cache line had previously required an ECC error correction at the lowered voltage, and provide a signature for the failure. When a failure occurs, processing is as follows. If there are no previously stored syndrome bits, this is the first occurrence of an error and the syndrome is stored. Otherwise, the new syndrome is compared with the stored syndrome. When compared with the stored syndrome bits for the line at 360 using a comparator 300 two possibilities exist. First, the new syndrome at the lowered voltage may be the same as the old. This is acceptable, because this would indicate that the same bit failed as did the previous time, and thus the failure was due to the same outlier cell as before. If the syndrome is different however, the comparison could indicate that two failures had occurred in the cache line. This would indicate a failure of the ECC scheme for the cache at the lowered minimum operating voltage, which would generally be reported out to the processor for error handling. As noted above, this would be a very rare occurrence at a correctly selected voltage shift. A cruder test of the cache for exclusively single-bit failures may be performed by a counter 310 coupled to the correction logic to determine if the number of failures corrected by the correction logic exceeded a low number (such as 100) at which multiple failures in a single cache line are of very low probability. The results of either a syndrome bit comparison test or the simpler counter test or both may be passed through a pass-fail logic unit 320 to produce an output that may be used to record the results of the test.

The above embodiments are provided to illustrate the claimed subject matter. Many other embodiments are possible, as is known in the art. For one example, the ECC error correction scheme is only one of many memory parity and other memory error correction schemes known in the art. Many of these schemes may be used in some embodiments, as long as the schemes are capable of at least single bit per cache line error detection and correction. Furthermore, as indicated above, multiple-bit correction schemes allow increasingly aggressive voltage reductions in some embodiments. It is not in general necessary to reuse soft error correction hardware for outlier cell correction in the context of aggressively lowered minimum operating voltages for processor cores. In some embodiments, separate schemes may be used for soft error correction and for outlier cell correction; in other embodiments, soft error correction may not be required or desired.

The testing scheme shown in FIG. 3 may not be used in some embodiments, or alternate testing schemes may be used. The cache may not be tested at all to guarantee exclusively single bit failures in some cases, such as for example where manufacturing time, cost and die area are paramount and reliability of the processor based system is of low criticality or where advanced error correction is used to correct errors.

While certain exemplary embodiments have been described above and shown in the accompanying drawings, it is to be understood that such embodiments are merely illustrative of and not restrictive on the broad aspects of various embodiments of the invention, and that these embodiments not be limited to the specific constructions and arrangements shown and described, since various other modifications are possible. It is possible to implement the embodiments or some of their features in hardware, programmable devices, firmware, software or a combination thereof.

Embodiments may be provided as a computer program product that may include a machine-readable medium having stored thereon data which when accessed by a machine may cause the machine to perform a process according to the claimed subject matter. The machine-readable medium may include, but is not limited to, floppy diskettes, optical disks, DVD-ROM disks, DVD-RAM disks, DVD-RW disks, DVD+RW disks, CD-R disks, CD-RW disks, CD-ROM disks, and magneto-optical disks, ROMs, RAMs, EPROMs, EEPROMs, magnet or optical cards, flash memory, or other type of media/machine-readable medium suitable for storing electronic instructions. Moreover, embodiments may also be downloaded as a computer program product, wherein the program may be transferred from a remote computer to a requesting computer by way of data signals embodied in a carrier wave or other propagation medium via a communication link (e.g., a modem or network connection).

Many of the methods are described in their most basic form but steps can be added to or deleted from any of the methods and information can be added or subtracted from any of the described messages without departing from the basic scope of the claimed subject matter. It will be apparent to those skilled in the art that many further modifications and adaptations can be made. The particular embodiments are not provided to limit the invention but to illustrate it. The scope of the claimed subject matter is not to be determined by the specific examples provided above but only by the claims below.

What is claimed is:

1. A method of operating a cache comprising volatile memory cells in a mobile processor system, the method comprising:
   determining a first voltage value as a minimum operating voltage (Vcc min) of the cache if each of the volatile memory cells functions correctly when the first voltage value is set as Vcc min;
   setting a Vcc min of the cache to a second voltage value at which the number of volatile memory cells that fail in the cache is between approximately 0.1% and approximately 1% of the number of lines in the cache, while the remaining volatile memory cells continue to function correctly at the second voltage value chosen for Vcc min; and
   compensating for errors produced by volatile memory cells in the cache that fail when operated at the second voltage value chosen for Vcc min to enable operation of the mobile processor system at a reduced Vcc min equal to the second voltage value that is less than the first voltage value.

2. The method of claim 1, wherein compensating for errors produced by memory cells in the cache that fail at the voltage value chosen for Vcc min further comprises compensating for errors produced by memory cells in the cache that fail at the value chosen for the minimum operating voltage using an error correcting code (ECC) unit.

3. The method of claim 2 further comprising compensating for soft errors in memory cells caused by radiation using the ECC unit.

4. The method of claim 2 further comprising producing and storing a signature comprising an indication of the memory cells that fail in the cache.

5. The method of claim 4 wherein the indication further comprises the number of memory cells that failed for each line of the cache.

6. The method of claim 4 wherein the signature further comprises a total of all the memory cells that failed in the cache.

7. The method of claim 6 wherein the error correcting code unit comprises a single bit error correcting code unit.

8. The method of claim 2 further comprising:
   for a cache with at least ten thousand cache lines, setting Vcc min to a value at which the number of cells that fail in the cache is approximately one hundred cells.

9. A method in a mobile processor system, the method comprising:
   in a cache, the cache further comprising volatile memory cells,
   determining a first voltage value as a minimum operating voltage (Vcc min) for the cache if each of the volatile memory cells functions correctly when the second voltage value is set as Vcc min;
   setting Vcc min of the cache to a second voltage value that exceeds an estimate of the mean (M) of the operating voltages at which the volatile memory cells fail by between approximately 3.7 and 4.7 times an estimate of the standard deviation (SD) of the operating voltages at which the volatile memory cells fail (M+approximately 3.7*SD<=Vcc min<=M+approximately 4.7*SD); and
   compensating for errors produced by volatile memory cells in the cache that fail when operated at the second voltage value chosen for the minimum operating voltage using a single bit error correcting code (ECC) unit to enable operation of the mobile processor system at a reduced Vcc min equal to the second voltage value that is less than the first voltage value;
   compensating for soft errors in volatile memory cells caused by radiation using the ECC unit; and
   producing and storing a signature comprising an indication of the volatile memory cells that fail in the cache.

10. The method of claim 9 further comprising:
    estimating the mean of the operating voltage at which a memory cell of the cache fails; and
    estimating the standard deviation of the operating voltages at which the memory cells in the cache fail.

11. The method of claim 10 further comprising setting the minimum operating voltage of the cache to a voltage value that exceeds an estimate of the mean (M) of the operating voltages at which the memory cells fail by about 4.2 times an estimate of the standard deviation (SD) of the operating voltages at which the memory cells fail (that is, ~M+4.2*SD).

12. A processor comprising:
    a cache comprising volatile memory cells;
    a voltage source to determine a first voltage value as a minimum operating voltage (Vcc min) of the cache if each of the volatile memory cells functions correctly when the second voltage value is set as Vcc min, and to set Vcc min of the cache to a second voltage value at which the number of volatile memory cells that fail in the cache is between approximately 0.1% and approximately 1% of the number of lines in the cache, while the remaining volatile memory cells continue to function correctly at the second voltage value chosen for Vcc min; and
    error compensation logic to compensate for errors produced by volatile memory cells in the cache that fail when operated at the voltage value chosen for Vcc min to enable operation of the mobile processor system at a reduced Vcc min equal to the second voltage value that is less than the first voltage value.

13. The processor of claim 12, wherein the error compensation logic comprises an error correcting code (ECC) unit.

14. The processor of claim 13 wherein the ECC unit is to compensate for soft errors in memory cells caused by radiation.

15. The processor of claim 13 further comprising syndrome logic to produce and store a signature comprising an indication of the memory cells that fail in the cache.

16. The processor of claim 15 wherein the indication further comprises the number of memory cells that failed for each line of the cache.

17. The processor of claim 15 wherein the signature further comprises a total of all the memory cells that failed in the cache.

18. The processor of claim 17 wherein the error correcting code unit comprises a single bit error correcting code unit.

19. The processor of claim 13 wherein, if the cache comprises at least ten thousand cache lines, the voltage source is further to set Vcc min to a value at which the number of cells that fail in the cache is approximately one hundred cells.

20. A processor comprising:
a cache, the cache further comprising volatile memory cells,
a voltage source to determine a first voltage value as a minimum operating voltage (Vcc min) of the cache if each of the volatile memory cells functions correctly when the second voltage value is set as Vcc min, and to set a Vcc min of the cache to a second voltage value that exceeds an estimate of the mean (M) of the operating voltages at which the volatile memory cells fail by between approximately 3.7 and 4.7 times an estimate of the standard deviation (SD) of the operating voltages at which the volatile memory cells fail (M+approximately 3.7*SD<=Vcc min<=M+approximately 4.7*SD);
an error correcting code (ECC) unit to compensate for errors produced by volatile memory cells in the cache that fail when operated at the voltage value chosen for the minimum operating voltage, to enable operation of the mobile processor system at a reduced Vcc min equal to the second voltage value that is less than the first voltage value, and to compensate for soft errors in volatile memory cells caused by radiation using the ECC unit; and
syndrome logic to produce and store a signature comprising an indication of the volatile memory cells that fail in the cache.

21. The processor of claim 20 further comprising setting the minimum operating voltage of the cache to a voltage value that exceeds an estimate of the mean (M) of the operating voltages at which the memory cells fail by approximately 4.2 times an estimate of the standard deviation (SD) of the operating voltages at which the memory cells fail (that is, ~M+approximately 4.2* SD).

22. A system comprising a processor, the processor comprising:
a cache comprising volatile memory cells;
a voltage source to determine a first voltage value as a minimum operating voltage Vcc min of the cache if each of the volatile memory cells functions correctly when the second voltage value is set as Vcc min, and to set a Vcc min of the cache to a second voltage value at which the number of volatile memory cells that fail in the cache is between approximately 0.1% and approximately 1% of the number of lines in the cache, while the remaining volatile memory cells continue to function correctly at the second voltage value chosen for Vcc min; and
error compensation logic to compensate for errors produced by volatile memory cells in the cache that fail when operated at the voltage value chosen for Vcc min to enable operation of the mobile processor system at a reduced Vcc min equal to the second voltage value that is less than the first voltage value.

23. The system of claim 22, wherein the error compensation logic further comprises an error correcting code (ECC) unit.

24. The system of claim 23 further comprising syndrome logic to produce and store a signature comprising an indication of the memory cells that fail in the cache.

25. The system of claim 24 wherein the indication further comprises the number of memory cells that failed for each line of the cache.

26. The system of claim 24 wherein the signature further comprises a total of all the memory cells that failed in the cache.

27. The system of claim 26 wherein the error correcting code unit comprises a single bit error correcting code unit.

28. The system of claim 23 wherein, if the cache comprises at least ten thousand cache lines, the voltage source is further to set Vcc min to a value at which the number of cells that fail in the cache is approximately one hundred cells.

29. The system of claim 22 wherein the ECC unit is further to compensate for soft errors in memory cells caused by radiation.

30. The system of claim 22 further comprising a dynamic random access memory (DRAM) communicatively coupled to the processor.

* * * * *